(12) United States Patent
Kim

(10) Patent No.: US 9,620,742 B2
(45) Date of Patent: Apr. 11, 2017

(54) ORGANIC LIGHT EMITTING DIODE DISPLAY

(71) Applicant: SAMSUNG DISPLAY CO., LTD., Yongin, Gyeonggi-Do (KR)

(72) Inventor: Dong Cheol Kim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/612,112

(22) Filed: Feb. 2, 2015

(65) Prior Publication Data

US 2016/0072094 A1   Mar. 10, 2016

(30) Foreign Application Priority Data

Sep. 10, 2014   (KR) .......................... 10-2014-0119611

(51) Int. Cl.
*H01L 51/52*   (2006.01)
*H05K 1/14*   (2006.01)
*H01L 27/32*   (2006.01)

(52) U.S. Cl.
CPC ........ *H01L 51/529* (2013.01); *H01L 27/3244* (2013.01); *H01L 51/5237* (2013.01); *H05K 1/147* (2013.01); *H05K 2201/10128* (2013.01)

(58) Field of Classification Search
CPC   H01L 27/3244; H01L 51/5237; H01L 51/529
USPC .............................................. 257/40; 313/500
See application file for complete search history.

(56) References Cited

U.S. PATENT DOCUMENTS

| | | | |
|---|---|---|---|
| 8,492,969 B2 * | 7/2013 | Lee ........................ | H05B 33/04 313/504 |
| 2009/0085454 A1 * | 4/2009 | Li ......................... | H01L 51/529 313/46 |
| 2013/0193415 A1 * | 8/2013 | Choi ...................... | H01L 51/52 257/40 |
| 2014/0103809 A1 * | 4/2014 | Bang .................... | H01L 51/529 315/113 |

FOREIGN PATENT DOCUMENTS

| | | |
|---|---|---|
| KR | 10-2013-0040661 A | 4/2013 |
| KR | 10-2013-0088102 A | 8/2013 |
| KR | 10-2014-0001702 A | 1/2014 |

* cited by examiner

*Primary Examiner* — Tung X Le
(74) *Attorney, Agent, or Firm* — Lewis Roca Rothgerber Christie LLP

(57) ABSTRACT

An organic light emitting diode display includes: an organic light emitting diode panel; a first composite sheet including a first heat dissipation sheet and a first buffer sheet below the organic light emitting diode panel; a second composite sheet including a second heat dissipation sheet and a second buffer sheet and disposed below the organic light emitting diode panel and spaced apart from the first composite sheet; a first heat source below the first composite sheet; and a second heat source above the second composite sheet.

16 Claims, 9 Drawing Sheets

ORGANIC LIGHT EMITTING DIODE DISPLAY

CROSS-REFERENCE TO RELATED APPLICATION

This application claims priority to and the benefit of Korean Patent Application No. 10-2014-0119611 filed on Sep. 10, 2014 in the Korean Intellectual Property Office, the entire content of which is incorporated herein by reference.

BACKGROUND

1. Field

An embodiment of the present inventive concept relates to an organic light emitting diode display.

2. Description of the Related Art

An organic light emitting diode display is a self-luminous type or kind of display device for displaying an image by using organic light emitting diodes that emit light.

The organic light emitting diode display may have relatively reduced thickness and weight because it does not require a separate light source, unlike a liquid crystal display. In addition, since the organic light emitting diode display exhibits high-quality properties such as low power consumption, high luminance and a high reaction speed, it has attracted attention as the next generation display for portable electronic devices.

The organic light emitting diode display includes an organic light emitting diode panel for displaying an image. In addition, the organic light emitting diode display is configured to include a plurality of components such as a drive circuit for driving the organic light emitting diode panel and a power supply unit for supplying power to the drive circuit. Accordingly, heat is generated in a process of displaying an image.

SUMMARY

Aspects of embodiments of the present inventive concept are directed toward an organic light emitting diode display that minimizes or reduces the occurrence of hot spots.

According to an embodiment, an organic light emitting diode display includes: an organic light emitting diode panel; a first composite sheet including a first heat dissipation sheet and a first buffer sheet below the organic light emitting diode panel; a second composite sheet including a second heat dissipation sheet and a second buffer sheet below the organic light emitting diode panel and spaced apart from the first composite sheet; a first heat source below the first composite sheet; and a second heat source above the second composite sheet.

The organic light emitting diode panel may further include a first substrate including organic light emitting diodes and a second substrate on the first substrate. The first composite sheet may further include a first adhesive sheet to bond the first substrate and the first buffer sheet to each other. The first heat dissipation sheet may be below the first buffer sheet.

In one embodiment, the second composite sheet may further include a second adhesive sheet to bond the first substrate and the second buffer sheet to each other. The second heat dissipation sheet may be below the second buffer sheet.

In another embodiment, the second composite sheet may further include a second adhesive sheet to bond the first substrate and the second heat dissipation sheet to each other. The second buffer sheet may be below the second heat dissipation sheet.

The organic light emitting diode display may further include a first printed circuit board below the first heat dissipation sheet, a second printed circuit board, at least a portion of the second printed circuit board being below the second heat dissipation sheet, and a support member for supporting the organic light emitting diode panel.

The support member may be between the first printed circuit board and the second printed circuit board. The first printed circuit board may be below the support member. The first printed circuit board may extend below a lower portion of the second heat dissipation sheet. The second printed circuit board may be on the support member. The second printed circuit board may extend below a lower portion of the first heat dissipation sheet.

The first printed circuit board may include the first heat source. The first heat source may include at least one selected from the group consisting of an application processor (AP) and a direct current to direct current (DC-DC) converter.

The second printed circuit board may be electrically coupled to the second heat source, and the second heat source may include an integrated circuit chip (IC chip) mounted on the organic light emitting diode panel.

In one embodiment, the first substrate may include a base substrate including a glass substrate. The first adhesive sheet bonds the glass substrate and the first buffer sheet to each other. In one embodiment, the second adhesive sheet bonds the glass substrate and the second buffer sheet to each other. In another embodiment, the second adhesive sheet bonds the glass substrate and the second heat dissipation sheet to each other.

In another embodiment, the first substrate may include a base substrate including a first polymer resin thin film and the organic light emitting diode display may further include a protective film between the first polymer resin thin film and the first adhesive sheet and between the first polymer resin thin film and the second adhesive sheet to protect a lower portion of the first polymer resin thin film. The protective film may include a second polymer resin thin film of a protective layer and an adhesive layer for bonding the protective layer to the first polymer resin thin film.

Each of the first heat dissipation sheet and the second heat dissipation sheet may include at least one selected from the group consisting of a graphite sheet and a metal sheet.

Each of the first buffer sheet and the second buffer sheet may include a polymer resin foam.

The organic light emitting diode display may further include a polarizer on the organic light emitting diode panel. The organic light emitting diode display may further include a cover window above the polarizer. The organic light emitting diode display may further include a resin layer between the organic light emitting diode panel and the cover window.

According to another embodiment, an organic light emitting diode display includes: an organic light emitting diode panel; a first composite sheet including a first heat dissipation sheet and a first buffer sheet below the organic light emitting diode panel; a second composite sheet including a second heat dissipation sheet and a second buffer sheet below the organic light emitting diode panel; a first region where the first composite sheet and the second composite sheet are separated and spaced apart from each other; a second region where the first composite sheet and the second composite sheet are coupled to each other; a first heat source below the first composite sheet in the first region; and a second heat source above the second composite sheet in the first region.

The organic light emitting diode panel may further include a first substrate including organic light emitting diodes and a second substrate on the first substrate. The first composite sheet may further include a first adhesive sheet to bond the first substrate and the first buffer sheet to each other, and the first heat dissipation sheet may be below the first buffer sheet. The second composite sheet may further include a second adhesive sheet to bond the first substrate and the second buffer sheet to each other, and the second heat dissipation sheet may be below the second buffer sheet.

Embodiments of the inventive concept provide at least the following effects.

Since the first heat dissipation sheet of the first composite sheet and the second heat dissipation sheet of the second composite sheet are separated from each other two-dimensionally (e.g., are spaced apart), heat generated from each of different heat sources can be discharged to the outside atmosphere through a separation space between the first heat dissipation sheet and the second heat dissipation sheet without or substantially without being transferred through the first heat dissipation sheet and the second heat dissipation sheet. Thus, it is possible to minimize or reduce the occurrence of hot spots.

In addition, the arrangement of the buffer sheet and the heat dissipation sheet of each of the first composite sheet and the second composite sheet differs according to the respective positions of the first heat source and the second heat source. For example, the location of the buffer sheet and the heat dissipation sheet of each of the first composite sheet and the second composite sheet may correspond to the respective location of the first heat source and the second heat source. Accordingly, the first heat dissipation sheet and the second heat dissipation sheet can be separated from each other three-dimensionally. Thus, it is possible to minimize or further reduce the occurrence of hot spots.

However, the effects of the present invention are not restricted to those described herein. The above and other effects of embodiments of the present invention will become more apparent to one of ordinary skill in the art to which the present invention pertains by referencing the following description, drawings, and claims.

BRIEF DESCRIPTION OF THE DRAWINGS

The above and other aspects and features of the present inventive concept will become more apparent in the following description of exemplary embodiments thereof with reference to the attached drawings, in which.

DETAILED DESCRIPTION

Figure 1:
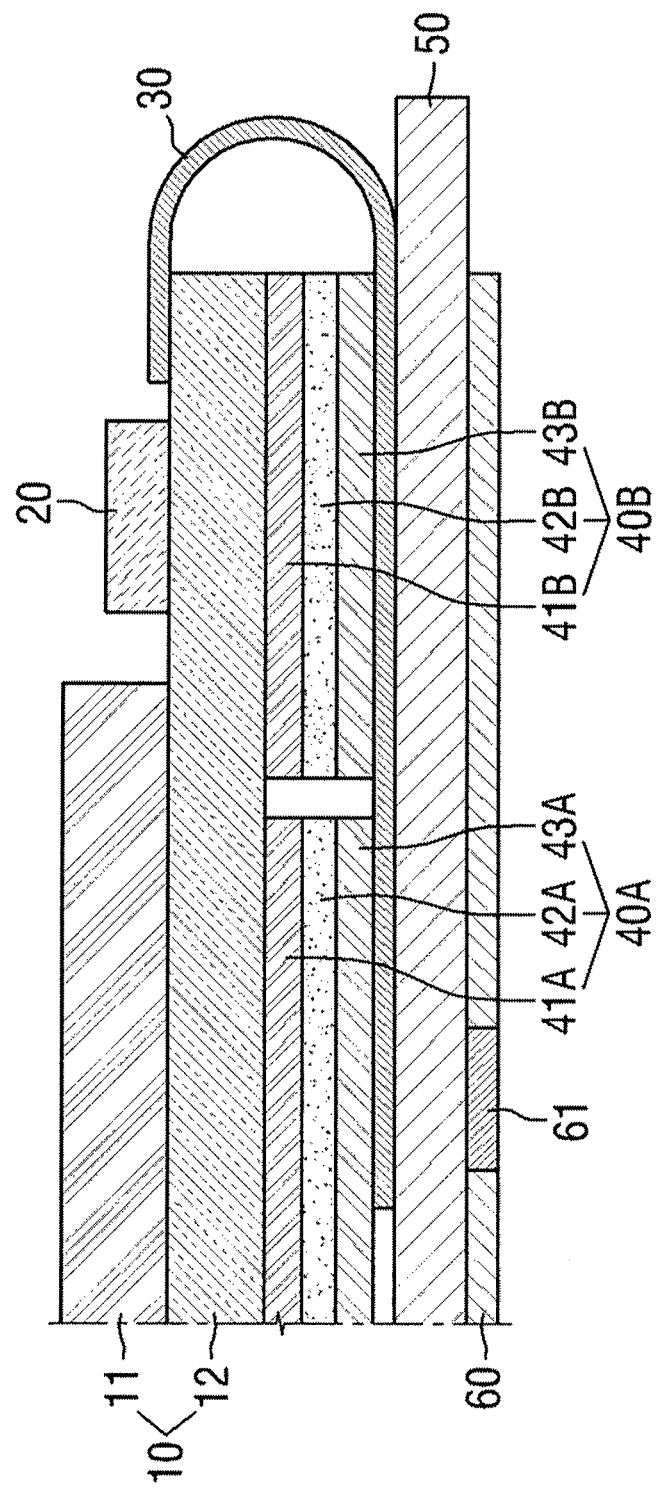
FIG. 1 is a cross-sectional view schematically showing an organic light emitting diode display according to a first embodiment of the inventive concept.

Features of the inventive concept and methods of accomplishing the same may be understood more readily by reference to the following detailed description of certain embodiments and the accompanying drawings. The inventive concept, however, may be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will only be defined by the appended claims, and equivalents thereof.

In the drawings, the thickness of layers and regions may be exaggerated for clarity. It will be understood that when an element or layer is referred to as being "on," "connected to" or "coupled to" another element or layer, the element or layer can be directly on, connected to or coupled to the other element or layer or be indirectly on, connected to or coupled to with one or more intervening elements or layers interposed therebetween. As used herein, the expression "connected to" may refer to elements being physically, electrically and/or fluidly connected to each other.

Like numbers refer to like elements throughout. It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section without departing from the spirit of the invention.

It will be further understood that the terms "comprises," "comprising," "includes" and/or "including," when used in this specification, specify the presence of stated features, integers, acts, operations, elements, and/or components, but do not preclude the presence or addition of one or more other features, integers, acts, operations, elements, components, and/or groups thereof.

Spatially relative terms, such as "below," "lower," "under," "above," "upper" and the like, may be used herein for ease of description to describe the relationship of one element or feature to another element(s) or feature(s) as illustrated in the drawings. It will be understood that the spatially relative terms are intended to encompass different orientations of the device in use or operation, in addition to the orientations depicted in the drawings. For example, if the device in the drawings is turned over, elements described as "below" or "beneath" relative to other elements or features would then be oriented "above" relative to the other elements or features. Thus, the exemplary term "below" can encompass both an orientation of above and below, depending upon the point of view. The device may be otherwise oriented (rotated 90 degrees or at other orientations) and the spatially relative descriptors used herein interpreted accordingly.

Hereinafter, embodiments of the inventive concept will be described with reference to the accompanying drawings.

Figure 2:
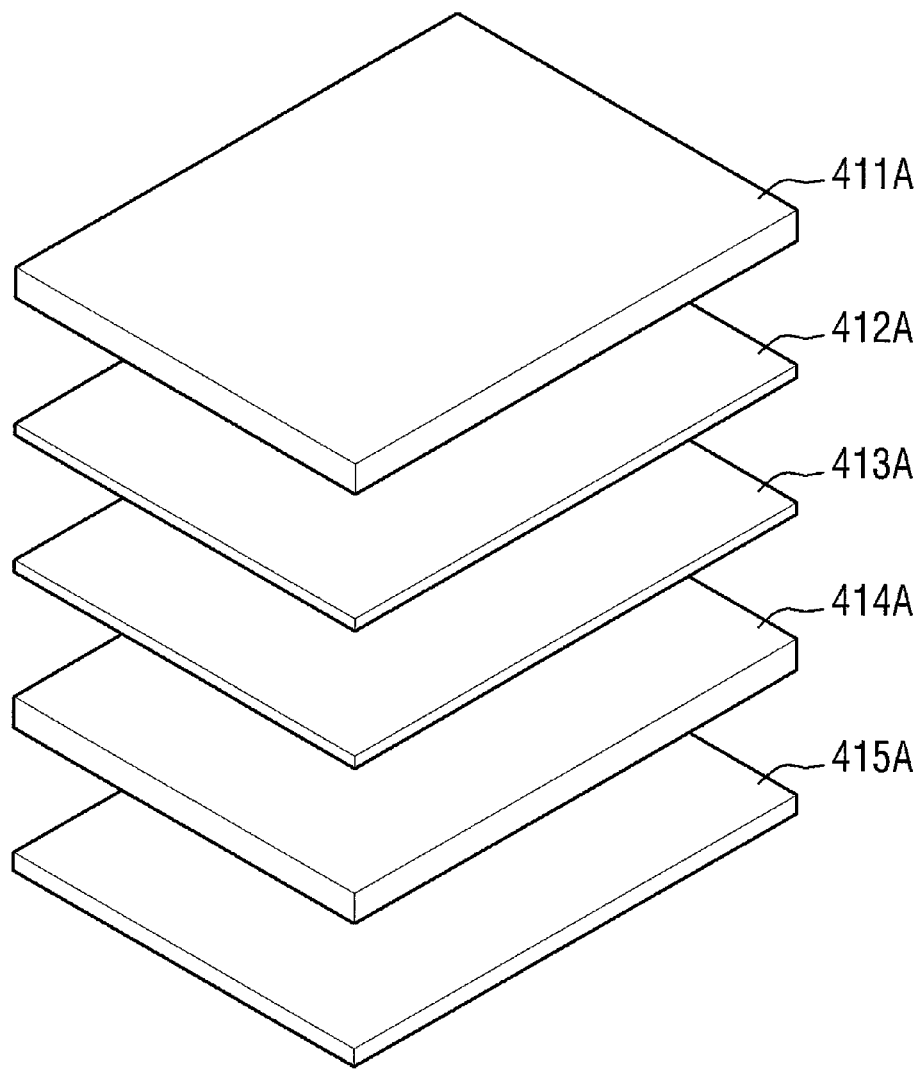
FIG. 2 is an exploded perspective view schematically showing a first adhesive sheet of the first embodiment of the inventive concept.
Figure 3:
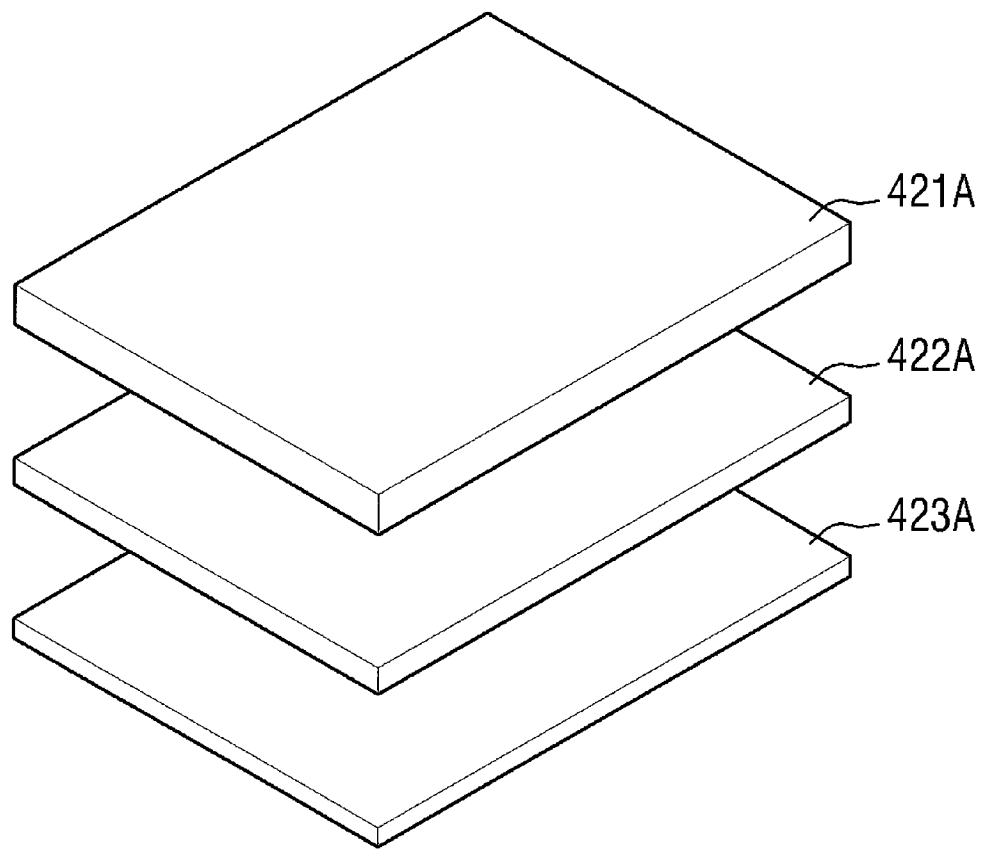
FIG. 3 is an exploded perspective view schematically showing a first buffer sheet of the first embodiment of the inventive concept.

FIG. 1 is a cross-sectional view schematically showing an organic light emitting diode display 100 according to a first embodiment of the inventive concept. FIG. 2 is an exploded perspective view schematically showing a first adhesive sheet of the first embodiment of the inventive concept. FIG. 3 is an exploded perspective view schematically showing a first buffer sheet of the first embodiment of the inventive concept.

Referring to FIGS. 1 to 3, the organic light emitting diode display 100 may be configured to include an organic light emitting diode panel 10, an integrated circuit chip 20, a second printed circuit board 30, a first composite sheet 40A, a second composite sheet 40B, a support member 50, a first printed circuit board 60 and an application processor (AP) 61.

The organic light emitting diode panel 10 may include panels of various forms. For example, a bottom emission type or kind of organic light emitting diode panel that emits light toward an array substrate on which thin film transistors (TFTs) are located or formed, a top emission type or kind of organic light emitting diode panel that emits light toward a counter substrate facing an array substrate, or the like may be used. Further, an organic light emitting diode panel in which thin film transistors (TFTs) and organic light emitting diodes are on or formed on the same array substrate, an organic light emitting diode panel in which thin film transistors (TFTs) and organic light emitting diodes are on or formed on different substrates, or the like may be used.

For the sake of descriptive simplicity, an organic light emitting diode panel that emits light toward an array substrate and in which thin film transistors and organic light emitting diodes are on or formed on the array substrate will be described by way of example, but the present disclosure is not limited thereto.

The organic light emitting diode panel 10 may include a first substrate 12 having a display area and a pad area, and a second substrate 11 on or bonded to the display area of the first substrate 12. The first substrate 12 may be an array substrate, and the second substrate 11 may be an encapsulation substrate that seals the first substrate 12. Each of the first substrate 12 and the second substrate 11 may include a base substrate including a glass substrate as a light transmitting substrate.

A plurality of signal lines including scan lines and data lines, a plurality of pixels, thin film transistors, drivers and the like may be on the display area of the first substrate 12. The plurality of pixels on the first substrate 12 emit light toward the second substrate 11. An outer surface of the second substrate 11 may be a display surface of the organic light emitting diode panel 10. The drivers and a plurality of metal wires connected to the signal lines may be located on the pad area.

The second substrate 11 may have or be formed to have a smaller size than the first substrate 12. The second substrate 11 may be attached to the display area of the first substrate 12. The first substrate 12 and the second substrate 11 may be bonded integrally by a sealant located or applied along an edge of the second substrate 11. The second substrate 11 may be bonded to the first substrate 12 to protect the pixels, the circuit and/or the wires on or formed on the first substrate 12 from the outside by sealing.

The integrated circuit chip 20 may be capable of transmitting a drive signal to the drivers of the first substrate 12 of the organic light emitting diode panel 10. The integrated circuit chip 20 may be on the pad area of the first substrate 12. The integrated circuit chip 20 may be mounted on the pad area of the first substrate 12 by a chip on glass (COG) technique, but the integrated circuit chip 20 is not limited thereto. The second substrate 11 and the integrated circuit chip 20 may be adjacent to each other two-dimensionally (e.g., in a plane), or the second substrate 11 and the integrated circuit chip 20 may be spaced apart from one another.

The second printed circuit board 30 may be capable of transmitting a drive signal to the organic light emitting diode panel 10. The second printed circuit board 30 may include electronic elements capable of processing the drive signal, and a connector capable of receiving a signal transmitted from the outside. The second printed circuit board 30 may be a flexible printed circuit board, but it is not limited thereto. The second printed circuit board 30 may be electrically coupled or connected to the organic light emitting diode panel 10. The second printed circuit board 30 may be bent (e.g., at least a portion thereof may have a curved shape) and at least a portion of the second printed circuit board 30 may be below the first composite sheet 40A and the second composite sheet 40B.

The first composite sheet 40A includes a composite sheet having a buffer function to buffer external shocks and a heat dissipation function to discharge the heat generated from the organic light emitting diode display 100 to the outside. The first composite sheet 40A may include or be configured to include a first adhesive sheet 41A, a first buffer sheet 42A and a first heat dissipation sheet 43A.

The first composite sheet 40A may be below the first substrate 12. The first adhesive sheet 41A may bond the first substrate 12 and the first buffer sheet 42A to each other. The first heat dissipation sheet 43A may be below the first buffer sheet 42A.

Similarly, the second composite sheet 40B includes a composite sheet having a buffer function to buffer external shocks and a heat dissipation function to discharge the heat generated from the organic light emitting diode display 100 to the outside. The second composite sheet 40B may include or be configured to include a second adhesive sheet 41B, a second buffer sheet 42B and a second heat dissipation sheet 43B.

The second composite sheet 40B may be below the first substrate 12. The second adhesive sheet 41B may bond the first substrate 12 and the second buffer sheet 42B to each other. The second heat dissipation sheet 43B may be below the second buffer sheet 42B.

The support member 50 may serve to support and protect the organic light emitting diode panel. In one embodiment, the support member 50 may include a set bracket coupled to a set case of the organic light emitting diode display. The support member 50 may include or be made of a durable material. For example, the support member 50 may include a fiber reinforced plastic (FRP) material such as carbon fiber reinforced plastic (CFRP) and glass fiber reinforced plastic (GFRP), but the support member 50 is not limited thereto.

The support member 50 may be below the organic light emitting diode panel 10. The first composite sheet 40A, the second composite sheet 40B and at least a portion of the second printed circuit board 30 may be interposed between the organic light emitting diode panel 10 and the support member 50.

The first printed circuit board 60 may be below the support member 50. The first printed circuit board 60 may be configured to include the application processor (AP) 61 and a direct current to direct current (DC-DC) converter. The first printed circuit board 60 may be on or mounted on the set case.

The application processor (AP) 61 may generate a drive signal for executing a command inputted from the outside, and may output the drive signal to the second printed circuit board 30. The DC-DC converter includes an electronic circuit device for converting a first DC voltage into a second DC voltage.

With the improvement of the performance of the integrated circuit chip 20, the application processor (AP) 61 and the DC-DC converter, a large amount of heat is generated therefrom. On the basis of the first composite sheet 40A and the second composite sheet 40B, the integrated circuit chip 20 is above the sheets 40A and 40B, and the application processor (AP) 61 is below the sheets 40A and 40B.

In the organic light emitting diode display 100 according to the first embodiment, a first heat source may include the application processor (AP) 61 and/or the DC-DC converter, and a second heat source may include the integrated circuit chip (IC chip) 20. The second printed circuit board 30 may be electrically coupled or connected to the second heat source.

The first composite sheet 40A may be above the application processor (AP) 61. The second composite sheet 40B may be below the integrated circuit chip (IC chip) 20. The first composite sheet 40A and the second composite sheet 40B are separated from each other (e.g., spaced apart from one another).

Since the first heat dissipation sheet 43A of the first composite sheet 40A and the second heat dissipation sheet 43B of the second composite sheet 40B are separated from each other two-dimensionally (e.g., are spaced apart), the heat generated from the application processor (AP) 61 and the integrated circuit chip (IC chip) 20, respectively, is separated spatially and may be discharged to the outside atmosphere through a separation space between the first heat dissipation sheet 43A and the second heat dissipation sheet 43B without or substantially without being transferred to each other through the first heat dissipation sheet 43A and the second heat dissipation sheet 43B. For example, the heat generated by the first heat source (e.g., the application processor (AP) 61 and/or the DC-DC converter) may be transferred to the first heat dissipation sheet 43A and then dissipated to the outside without a substantial portion of the heat being transferred the second heat dissipation sheet 43B. Similarly, the heat generated by the second heat source (e.g., the integrated circuit chip (IC chip) 20) may be transferred to the second heat dissipation sheet 43B and then dissipated to the outside without a substantial portion of the heat being transferred to the first heat dissipation sheet 43A. Accordingly, in some embodiments, the first heat dissipation sheet 43A and the second heat dissipation sheet 43B reduce an amount of heat transfer from the first heat dissipation sheet 43A to the second heat dissipation sheet 43B, and vice versa.

An integrated heat dissipation sheet covering all or substantially all of the bottom of the organic light emitting diode panel has been used to discharge the heat generated inside the organic light emitting diode display to the outside.

Since the integrated heat dissipation sheet includes or is formed of a material having excellent heat transfer and diffusion, even when heat sources are separated from each other spatially, the heat generated from each of the heat sources may be transferred to the integrated heat dissipation sheet, and hot spots may occur.

The first adhesive sheet 41A of the first composite sheet 40A will now be described with reference to FIG. 2.

Referring to FIG. 2, the first adhesive sheet 41A may be configured to include an embossed pattern forming film 411A, a first adhesive layer 412A, a light-shielding ink layer 413A, a polymer film base material 414A, and a second adhesive layer 415A.

The first adhesive sheet 41A not only serves to bond the first substrate 12 and the first buffer sheet 42A, but also has a light shielding function and a bubble generation prevention function (e.g., the first adhesive sheet 41A reduces the generation of bubbles).

For example, the embossed pattern forming film 411A has a fine pattern such as a grid or stripe pattern, but the fine pattern is not limited thereto. The fine pattern may form an embossed pattern on an upper surface of the first adhesive layer 412A. The embossed pattern forming film 411A is removed when or before the first composite sheet 40A is bonded to the first substrate 12.

Therefore, the bonding to the first substrate 12 is achieved by the first adhesive layer 412A (e.g., the first adhesive layer 412A may be directly bonded to the first substrate 12).

The embossed pattern on or formed on the upper surface of the first adhesive layer 412A may prevent air bubbles from being generated at or on the bonding surface between the first composite sheet 40A and the first substrate 12. (or the first adhesive layer 412A may reduce the generation of such bubbles). In a non-limiting embodiment, the first adhesive layer 412A may include or be made of an acrylic adhesive.

The light-shielding ink layer 413A is on or formed on a lower surface of the first adhesive layer 412A, and the light-shielding ink layer 413A may include or be an adhesive layer into which light-shielding ink is injected. In one embodiment, the light-shielding ink layer 413A may include or be a black ink layer, but the light-shielding ink layer 413A is not limited thereto.

The polymer film base material 414A may be attached to a lower surface of the light-shielding ink layer 413A, and the second adhesive layer 415A may be on or formed on a lower surface of the polymer film base material 414A.

In a non-limiting embodiment, the polymer film base material 414A may include or be formed of polyethylene terephthalate (PET). Further, in a non-limiting embodiment, the second adhesive layer 415A may include or be made of an acrylic adhesive.

The second adhesive layer 415A is provided for bonding to the first buffer sheet 42A below the first adhesive sheet 41A. If the second adhesive sheet 42A includes an adhesive layer that can be bonded to the polymer film base material 414A, however, the second adhesive layer 415A may be omitted. Thus, in some embodiments, the first adhesive sheet 41A does not include the second adhesive layer 415A.

The first buffer sheet 42A of the first composite sheet 40A will now be described with reference to FIG. 3.

The first buffer sheet 42A may include or be configured to include a polymer resin foam 421A, a polymer film base material 422A and an adhesive layer 423A.

The polymer resin foam 421A may have buffer capacity against external shocks (e.g., the polymer resin foam 421A may be capable of buffering or blunting external shocks). The polymer resin foam 421A may include or be a polymer resin foam having adhesiveness. In a non-limiting embodiment, the polymer resin foam 421A may include or be a melamine foam, phenol foam, acrylic foam, polyvinyl chloride foam, polypropylene foam, polyurethane foam, urea foam, polyethylene foam, polystyrene foam, polyvinyl acetate foam or the like, but the polymer resin foam 421A is not limited thereto.

The polymer film base material 422A and the adhesive layer 423A may be sequentially arranged below the polymer resin foam 421A.

In a non-limiting embodiment, the polymer film base material 422A may include or be made of polyethylene terephthalate (PET). Further, in a non-limiting embodiment, the adhesive layer 423A may include or be made of an acrylic adhesive.

The first heat dissipation sheet 43A may include or be at least one selected from the group consisting of a graphite sheet and a metal sheet, but the first heat dissipation sheet 43A is not limited thereto. For example, the graphite sheet or the metal sheet may be used alone, or the graphite sheet and the metal sheet may be used in combination. In the case of using the graphite sheet and the metal sheet in combination, the graphite sheet and the metal sheet may be sequentially arranged below the first buffer sheet 42A.

In a non-limiting embodiment, the metal sheet may include or be a copper (Cu) sheet.

Figure 4:
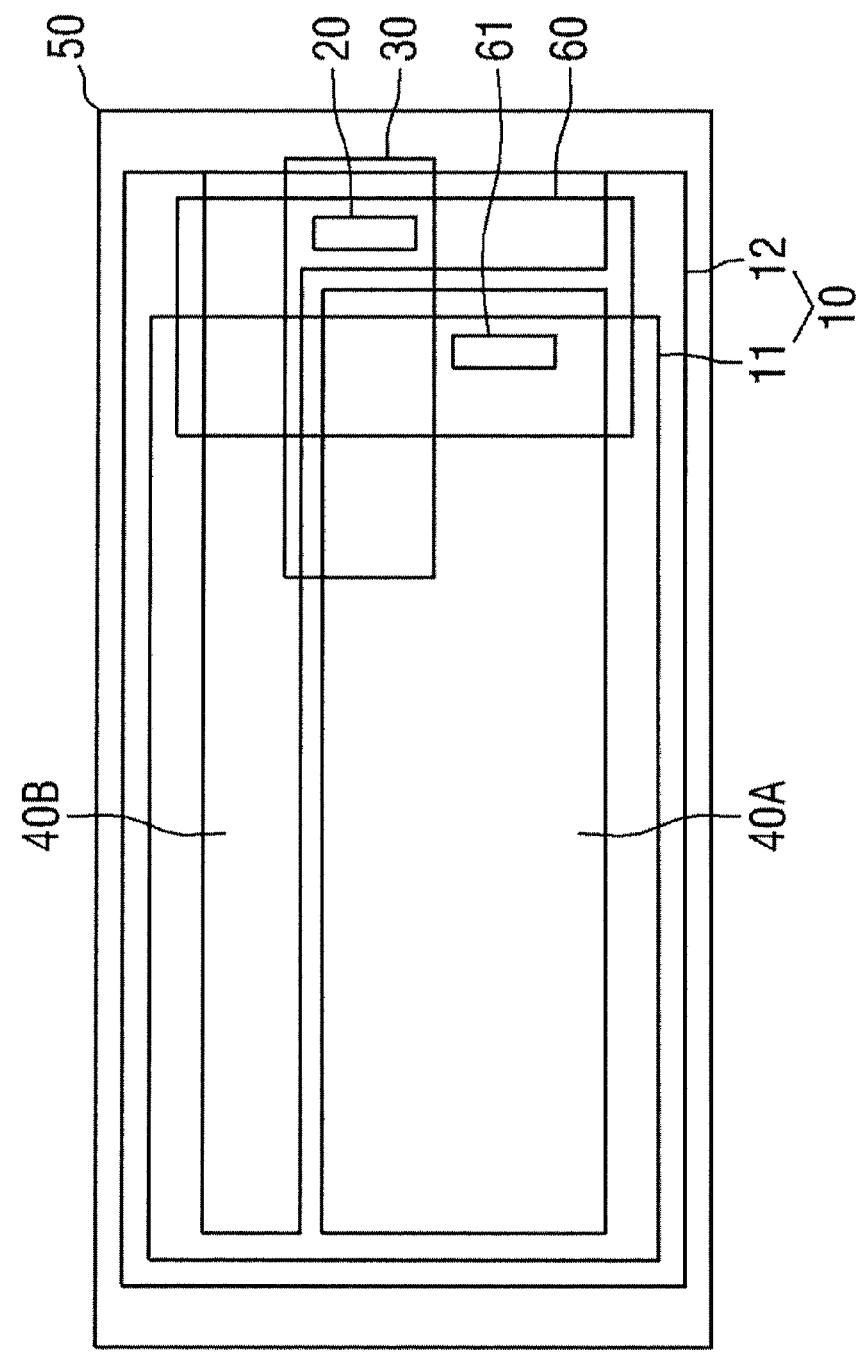
FIG. 4 is a schematic top view showing a layout of the organic light emitting diode display according to the first embodiment of the inventive concept.

FIG. 4 is a schematic top view showing a layout of the organic light emitting diode display 100 according to the first embodiment of the inventive concept.

Referring to FIG. 4, the first substrate 12 of the organic light emitting diode panel 10 has a relatively smaller area as compared to the support member 50, and may be arranged to completely overlap with a portion of the support member 50. The second substrate 11 has a relatively smaller area as compared to the first substrate 12, and may be arranged to completely overlap with a portion of the first substrate 12.

Each of the first composite sheet 40A and the second composite sheet 40B has a relatively smaller area as compared to the first substrate 12, and may be arranged to completely overlap with a portion of the first substrate 12. The first composite sheet 40A and the second composite sheet 40B may be arranged to be completely spaced apart from each other.

The application processor 61 has a relatively smaller area as compared to the first composite sheet 40A, and may be arranged to completely overlap with a portion of the first composite sheet 40A. The integrated circuit chip 20 has a relatively smaller area as compared to the second composite sheet 40B, and may be arranged to completely overlap with a portion of the second composite sheet 40B.

Figure 5:
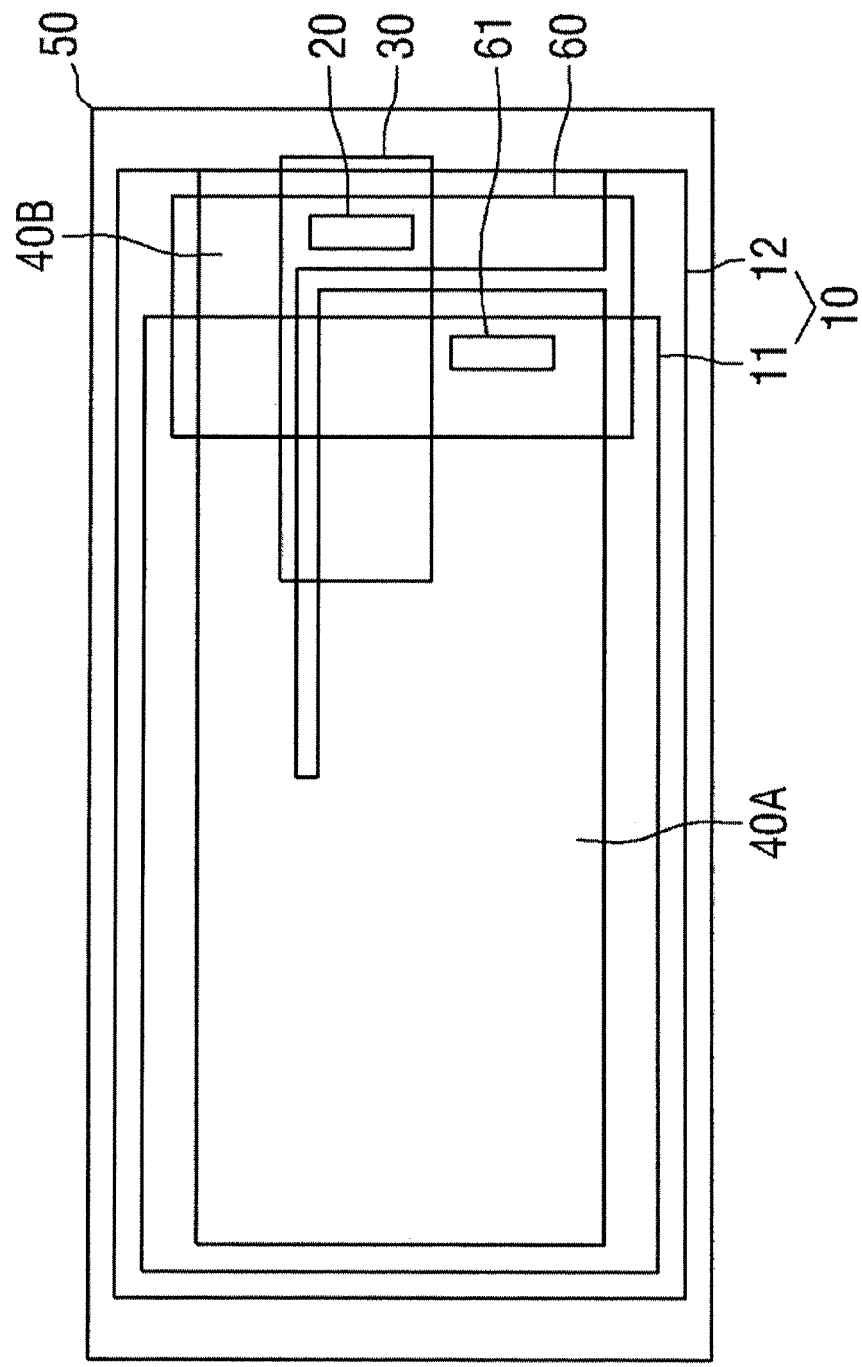
FIG. 5 is a schematic top view showing a layout of an organic light emitting diode display according to a second embodiment of the inventive concept.

FIG. 5 is a schematic top view showing a layout of an organic light emitting diode display 101 according to a second embodiment of the inventive concept.

The organic light emitting diode display 101 of FIG. 5 is different from the organic light emitting diode display 100 of FIG. 4 in that the first composite sheet 40A and the second composite sheet 40B of the organic light emitting diode display 101 are partially coupled to or connected to each other, whereas the first composite sheet 40A and the second composite sheet 40B of the organic light emitting diode display 100 are completely separated and spaced apart from each other.

When a region where the application processor 61 and the integrated circuit chip 20 are located is defined as a first region and a region where the application processor 61 and the integrated circuit chip 20 are not disposed is defined as a second region, the first composite sheet 40A and the second composite sheet 40B may be separated from each other in the first region, and the first composite sheet 40A and the second composite sheet 40B may be coupled to or connected to each other in the second region.

Also, in the organic light emitting diode display 101 of FIG. 5, in the first region, the application processor 61 may be arranged to completely overlap with a portion of the first composite sheet 40A, the integrated circuit chip 20 may be arranged to completely overlap with a portion of the second composite sheet 40B, and the first composite sheet 40A and the second composite sheet 40B may be separated and spaced apart from each other.

Figure 6:
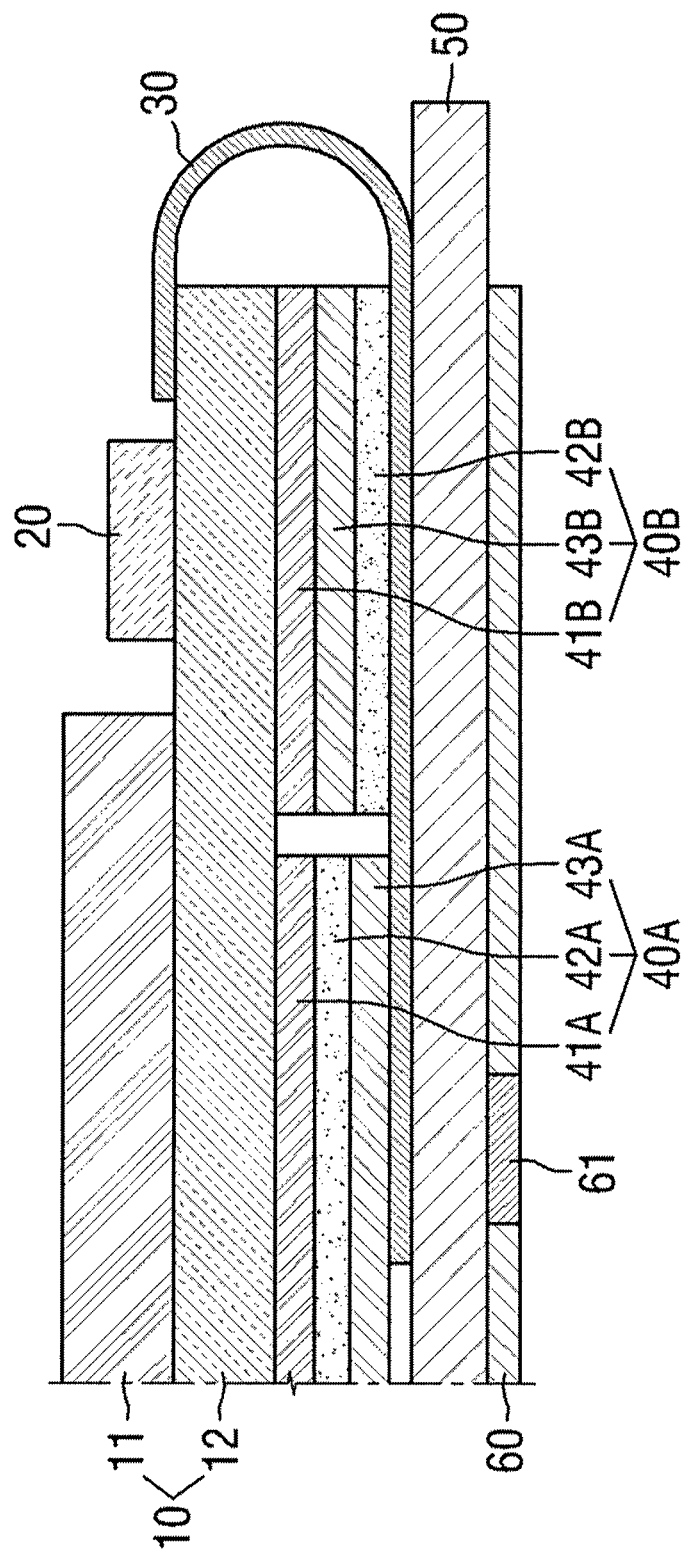
FIG. 6 is a cross-sectional view schematically showing an organic light emitting diode display according to a third embodiment of the inventive concept.

FIG. 6 is a cross-sectional view schematically showing an organic light emitting diode display 102 according to a third embodiment of the inventive concept.

The organic light emitting diode display 102 of FIG. 6 is different from the organic light emitting diode display 100 of FIG. 1 with respect to the arrangement of the second buffer sheet 42B and the second heat dissipation sheet 43B of the second composite sheet 40B.

In the organic light emitting diode display 102, the second heat dissipation sheet 43B is below the second adhesive sheet 41B such that the second heat dissipation sheet 43B is arranged closer to the integrated circuit chip 20 (as compared to the organic light emitting diode display 100), and the second buffer sheet 42B is below the second heat dissipation sheet 43B. This arrangement is different from the arrangement of FIG. 1 in which the second buffer sheet 42B is below the second adhesive sheet 41B, and the second heat dissipation sheet 43B is below the second buffer sheet 42B.

In the organic light emitting diode display 102, the first heat dissipation sheet 43A and the second heat dissipation sheet 43B are arranged closer to the application processor 61 and the integrated circuit chip 20, respectively. Further, the first heat dissipation sheet 43A and the second heat dissipation sheet 43B are separated from each other three-dimensionally (e.g., the first heat dissipation sheet 43A and the second heat dissipation sheet 43B are spaced apart from one another and lie in separate planes). Thus, it is possible to further minimize (or reduce) the occurrence of hot spots compared to the organic light emitting diode display 100 of FIG. 1.

Figure 7:
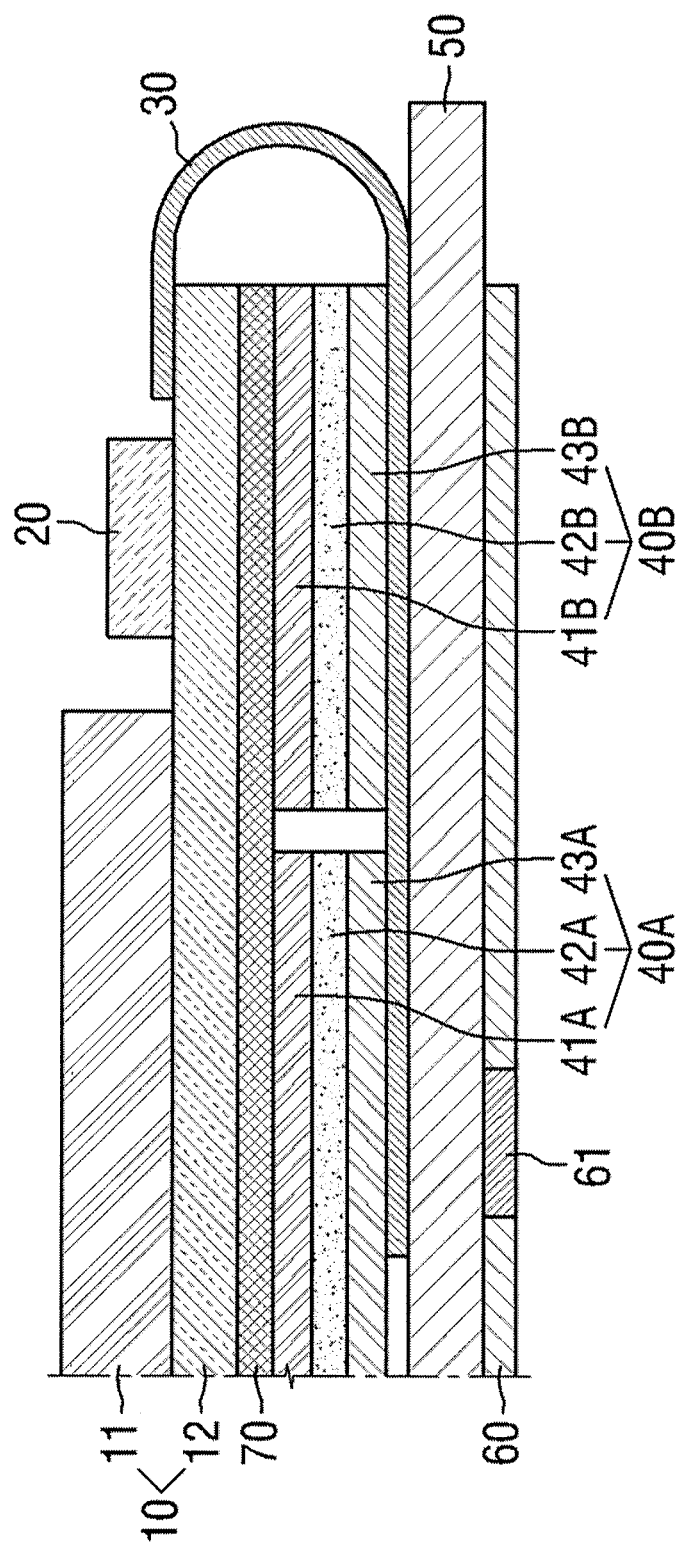
FIG. 7 is a cross-sectional view schematically showing an organic light emitting diode display according to a fourth embodiment of the inventive concept

FIG. 7 is a cross-sectional view schematically showing an organic light emitting diode display 103 according to a fourth embodiment of the inventive concept.

The organic light emitting diode display 103 of FIG. 7 is different from the organic light emitting diode display 100 of FIG. 1 in that a protective film 70 is interposed between a lower portion of the first substrate 12 and upper portions of the first composite sheet 40A and the second composite sheet 40B.

In the organic light emitting diode display 103 of FIG. 7, the first substrate 12 includes a base substrate including a polymer resin thin film (e.g., a first polymer resin thin film), and the protective film 70 is added to protect a lower portion of the first substrate 12 (e.g., to protect a lower portion of the first polymer resin thin film) unlike the organic light emitting diode display 100 of FIG. 1 in which the first substrate 12 includes a base substrate including a glass substrate.

Figure 8:
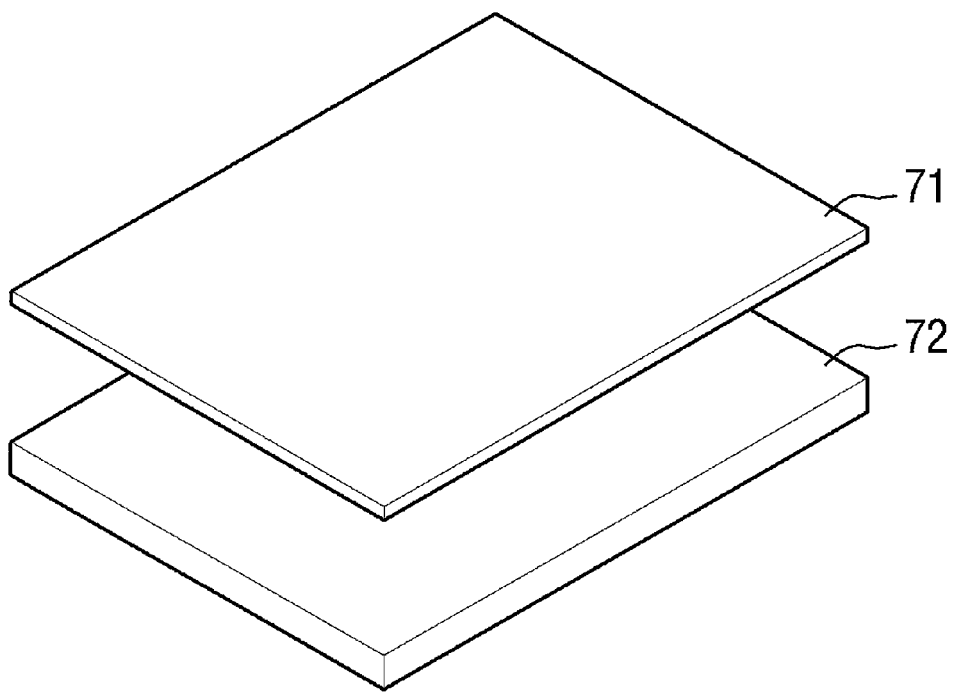
FIG. 8 is an exploded perspective view schematically showing a protective film of the fourth embodiment.

FIG. 8 is an exploded perspective view schematically showing an embodiment of the protective film 70 of the inventive concept.

The protective film 70 may include or be configured to include a protective layer 72 including a polymer resin thin film (e.g., a second polymer resin thin film) and an adhesive layer 71 for bonding the protective layer 72 to the first substrate 12.

In a non-limiting embodiment, the protective layer 72 may include or be made of polyethylene terephthalate (PET). Further, in a non-limiting embodiment, the adhesive layer 71 may include or be made of an acrylic adhesive.

Figure 9:
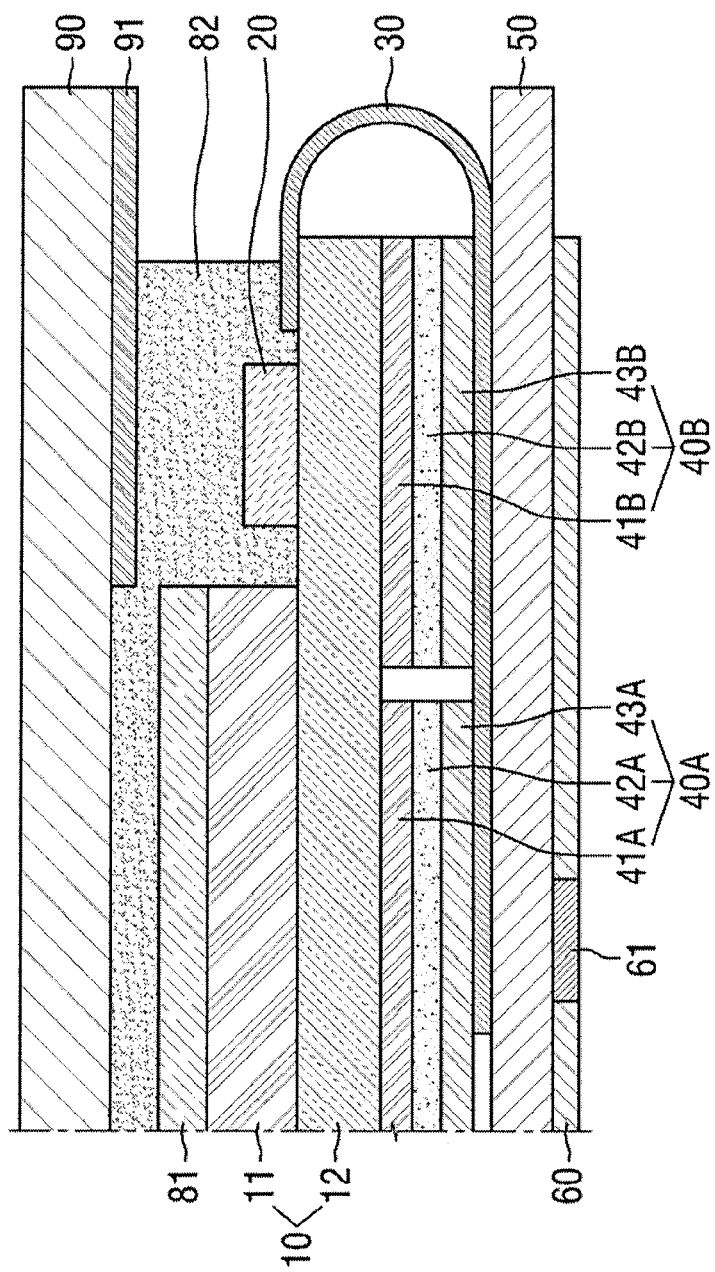
FIG. 9 is a cross-sectional view schematically showing an organic light emitting diode display according to a fifth embodiment of the inventive concept.

FIG. 9 is a cross-sectional view schematically showing an organic light emitting diode display 104 according to a fifth embodiment of the inventive concept.

The organic light emitting diode display 104 of FIG. 9 is different from the organic light emitting diode display 100 of FIG. 1 in that a cover window 90 is above the organic light emitting diode panel 10, and a resin layer 82 is between or formed between the organic light emitting diode panel 10 and the cover window 90.

Further, the organic light emitting diode display 104 of FIG. 9 is different from the organic light emitting diode display 100 of FIG. 1 in that a polarizer 81 is between the second substrate 11 and the cover window 90.

The resin layer 82 may be located between the organic light emitting diode panel 10 and the cover window 90 to bond the organic light emitting diode panel 10 to the cover window 90. For example, the resin layer 82 may fill or be formed to fill the whole or substantially the whole space between the polarizer 81 and the cover window 90 and the whole or substantially the whole space between the pad area of the organic light emitting diode panel 10 and the cover window 90.

The resin layer 82 may include an acrylic resin which is cured by ultraviolet light, but the resin layer 82 is not limited thereto. The resin layer 82 may be coated on the cover window 90 initially in a liquid or paste state, and may be cured by ultraviolet light after stacking the organic light emitting diode panel 10 and the cover window 90.

The cover window 90 may serve to protect the organic light emitting diode panel 10 such that the organic light emitting diode panel 10 is not broken by an external impact (or such that an amount or likelihood of such breakage is reduced). The cover window 90 may be located above the organic light emitting diode panel 10. A bezel printing layer 91 may be on or formed on the cover window 90.

The cover window 90 may include or be made of a transparent material such as a glass or a resin. The bezel printing layer 91 may include or be configured to include a metal deposition layer, a colored printing layer, and/or the like, but the bezel printing layer 91 is not limited thereto. The colored printing layer may include or be configured to include a black printing layer. The black printing layer may serve to shield or block light such that the pad area of the organic fight emitting diode panel 10 is not visually recognized or observable from the outside.

While the invention has been particularly shown and described with reference to exemplary embodiments thereof, it will be understood by those of ordinary skill in the art that various changes in form and detail may be made herein without departing from the spirit and scope of the invention as defined by the following claims, and equivalents thereof. The exemplary embodiments should be considered in a descriptive sense only and not for purposes of limitation.

What is claimed is:

1. An organic light emitting diode display comprising:
an organic light emitting diode panel;
a first composite sheet comprising a first heat dissipation sheet and a first buffer sheet below the organic light emitting diode panel;
a second composite sheet comprising a second heat dissipation sheet and a second buffer sheet below the organic light emitting diode panel and spaced apart from the first composite sheet;
a first heat source below the first composite sheet and overlapping with the first composite sheet; and
a second heat source above the second composite sheet and overlapping with the second composite sheet.

2. The organic light emitting diode display of claim 1, wherein the organic light emitting diode panel comprises a first substrate comprising organic light emitting diodes and a second substrate on the first substrate,
wherein the first composite sheet further comprises a first adhesive sheet to bond the first substrate and the first buffer sheet to each other, and the first heat dissipation sheet is below the first buffer sheet, and
wherein the second composite sheet further comprises a second adhesive sheet to bond the first substrate and the second buffer sheet to each other, and the second heat dissipation sheet is below the second buffer sheet.

3. The organic light emitting diode display of claim 2, wherein the first substrate comprises a base substrate comprising a glass substrate, the first adhesive sheet bonds the glass substrate and the first buffer sheet to each other, and the second adhesive sheet bonds the glass substrate and the second buffer sheet to each other.

4. The organic light emitting diode display of claim 2, wherein the first substrate comprises a base substrate comprising a first polymer resin thin film,
wherein the organic light emitting diode display further comprises a protective film between the first polymer resin thin film and the first adhesive sheet and between the first polymer resin thin film and the second adhesive sheet to protect a lower portion of the first polymer resin thin film, and
wherein the protective film comprises a second polymer resin thin film of a protective layer and an adhesive layer for bonding the protective layer to the first polymer resin thin film.

5. The organic light emitting diode display of claim 1, wherein the organic light emitting diode panel comprises a first substrate comprising organic light emitting diodes and a second substrate on the first substrate,
wherein the first composite sheet further comprises a first adhesive sheet to bond the first substrate and the first buffer sheet to each other, and the first heat dissipation sheet is below the first buffer sheet, and
wherein the second composite sheet further comprises a second adhesive sheet to bond the first substrate and the second heat dissipation to each other, and the second buffer sheet is below the second heat dissipation sheet.

6. The organic light emitting diode display of claim 5, wherein the first substrate comprises a base substrate comprising a glass substrate, the first adhesive sheet bonds the glass substrate and the first buffer sheet to each other, and the second adhesive sheet bonds the glass substrate and the second heat dissipation sheet to each other.

7. The organic light emitting diode display of claim 5, wherein the first substrate comprises a base substrate comprising a first polymer resin thin film,
wherein the organic light emitting diode display further comprises a protective film between the first polymer resin thin film and the first adhesive sheet and between the first polymer resin thin film and the second adhesive sheet to protect a lower portion of the first polymer resin thin film, and
wherein the protective film comprises a second polymer resin thin film of a protective layer and an adhesive layer for bonding the protective layer to the first polymer resin thin film.

8. The organic light emitting diode display of claim 1, wherein each of the first heat dissipation sheet and the second heat dissipation sheet comprises at least one selected from the group consisting of a graphite sheet and a metal sheet.

9. The organic light emitting diode display of claim 1, wherein each of the first buffer sheet and the second buffer sheet comprises a polymer resin foam.

10. The organic light emitting diode display of claim 1, further comprising:
a polarizer on the organic light emitting diode panel;
a cover window above the polarizer; and
a resin layer between the organic light emitting diode panel and the cover window.

11. An organic light emitting diode display comprising:
an organic light emitting diode panel;
a first composite sheet comprising a first heat dissipation sheet and a first buffer sheet below the organic light emitting diode panel;
a second composite sheet comprising a second heat dissipation sheet and a second buffer sheet below the organic light emitting diode panel and spaced apart from the first composite sheet;
a first heat source below the first composite sheet;
a second heat source above the second composite sheet; and
a first printed circuit board below the first heat dissipation sheet and a second printed circuit board, at least a portion of the second printed circuit board being below the second heat dissipation sheet, wherein a support member for supporting the organic light emitting diode panel is between the first printed circuit board and the second printed circuit board.

12. The organic light emitting diode display of claim 11, wherein the first printed circuit board is below the support member, and the first printed circuit board extends below a lower portion of the second heat dissipation sheet, and
wherein the second printed circuit board is on the support member, and the second printed circuit board extends below a lower portion of the first heat dissipation sheet.

13. The organic light emitting diode display of claim 11, wherein the first printed circuit board comprises the first heat source, and the first heat source comprises at least one selected from the group consisting of an application processor (AP) and a direct current to direct current (DC-DC) converter.

14. The organic light emitting diode display of claim 13, wherein the second printed circuit board is electrically coupled to the second heat source, and the second heat source comprises an integrated circuit chip mounted on the organic light emitting diode panel.

15. An organic light emitting diode display comprising:
an organic light emitting diode panel;
a first composite sheet comprising a first heat dissipation sheet and a first buffer sheet below the organic light emitting diode panel;
a second composite sheet comprising a second heat dissipation sheet and a second buffer sheet below the organic light emitting diode panel;
a first region where the first composite sheet and the second composite sheet are separated and spaced apart from each other;
a second region where the first composite sheet and the second composite sheet are coupled to each other;
a first heat source below the first composite sheet in the first region and overlapping with the first composite sheet; and
a second heat source above the second composite sheet and overlapping with the second composite sheet in the first region.

16. The organic light emitting diode display of claim 15, wherein the organic light emitting diode panel comprises a first substrate comprising organic light emitting diodes and a second substrate on the first substrate,
wherein the first composite sheet further comprises a first adhesive sheet to bond the first substrate and the first buffer sheet to each other, and the first heat dissipation sheet is below the first buffer sheet, and
wherein the second composite sheet further comprises a second adhesive sheet to bond the first substrate and the second buffer sheet to each other, and the second heat dissipation sheet is below the second buffer sheet.

* * * * *